(12) United States Patent
Guo et al.

(10) Patent No.: US 11,805,702 B2
(45) Date of Patent: Oct. 31, 2023

(54) METHODS OF FORMING PERPENDICULAR MAGNETORESISTIVE ELEMENTS USING SACRIFICIAL LAYERS

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

(*) Notice: Subject to any disclaimer, the term of this patent is extended or adjusted under 35 U.S.C. 154(b) by 357 days.

(21) Appl. No.: 17/313,976

(22) Filed: May 6, 2021

(65) Prior Publication Data

US 2022/0359818 A1     Nov. 10, 2022

(51) Int. Cl.
| | | |
|---|---|---|
| *H10N 50/01* | (2023.01) | |
| *H01F 10/32* | (2006.01) | |
| *G11C 11/16* | (2006.01) | |
| *H10B 61/00* | (2023.01) | |
| *H10N 50/10* | (2023.01) | |
| *H10N 50/80* | (2023.01) | |
| *H10N 50/85* | (2023.01) | |

(52) U.S. Cl.
CPC ........... *H10N 50/01* (2023.02); *G11C 11/161* (2013.01); *H01F 10/3286* (2013.01); *H10B 61/00* (2023.02); *H10N 50/10* (2023.02); *H10N 50/80* (2023.02); *H10N 50/85* (2023.02)

(58) Field of Classification Search
CPC ........ H10N 50/01; H10N 50/80; H10N 50/85; H10N 50/10; H10B 61/00; G11C 11/161; H01F 10/3286
See application file for complete search history.

(56) References Cited

U.S. PATENT DOCUMENTS

| | | | | |
|---|---|---|---|---|
| 9,362,489 | B1* | 6/2016 | Guo | H10N 50/80 |
| 2010/0329085 | A1* | 12/2010 | Kawamori | G11B 5/314 |
| | | | | 360/59 |
| 2014/0175581 | A1* | 6/2014 | Guo | H10N 50/00 |
| | | | | 257/421 |
| 2014/0198564 | A1* | 7/2014 | Guo | H10N 50/01 |
| | | | | 365/158 |
| 2014/0203341 | A1* | 7/2014 | Guo | H10N 50/10 |
| | | | | 257/295 |
| 2014/0210025 | A1* | 7/2014 | Guo | G11C 11/1673 |
| | | | | 257/421 |
| 2014/0217526 | A1* | 8/2014 | Guo | G11C 11/161 |
| | | | | 257/421 |
| 2014/0254252 | A1* | 9/2014 | Guo | G11C 11/161 |
| | | | | 365/158 |
| 2020/0083437 | A1* | 3/2020 | Guo | H10N 50/01 |
| 2021/0159401 | A1* | 5/2021 | Guo | H10N 50/85 |

(Continued)

*Primary Examiner* — Thao X Le
*Assistant Examiner* — Sean Ayers Winters

(57) ABSTRACT

A perpendicular magnetoresistive element comprises (counting from the element bottom): a reference layer having magnetic anisotropy in a direction perpendicular to a film surface and having an invariable magnetization direction; a tunnel barrier layer; a crystalline recording layer having magnetic anisotropy in a direction perpendicular to a film surface and having a variable magnetization direction; an oxide buffer layer; and a cap layer, wherein the crystalline recording layer consists of a CoFe alloy that is substantially free of boron and has BCC (body-centered cubic) CoFe grains having epitaxial growth with (100) plane parallel to a film surface.

20 Claims, 3 Drawing Sheets

(56) References Cited

U.S. PATENT DOCUMENTS

2022/0148785 A1* 5/2022 Guo ..................... G11C 11/161
2022/0238799 A1* 7/2022 Guo ..................... H10N 50/10
2022/0246836 A1* 8/2022 Guo ..................... H10B 61/20
2022/0278270 A1* 9/2022 Guo ..................... H10B 61/00

* cited by examiner

METHODS OF FORMING PERPENDICULAR MAGNETORESISTIVE ELEMENTS USING SACRIFICIAL LAYERS

RELATED APPLICATIONS

This application is a continuation in part of the U.S. utility patent application Ser. No. 16/824,657 filed on Mar. 19, 2020, which is a continuation in part of the U.S. utility patent application Ser. No. 14/063,204 filed on Oct. 25, 2013, which is based upon and claims the benefit of priority from US provisional patent application No. 61/740,764, filed Dec. 21, 2012, and the entire contents of each of which are incorporated herein by reference.

BACKGROUND OF THE INVENTION

1. Field of the Invention

This invention relates to the field of perpendicular magnetoresistive elements. More specifically, the invention comprises perpendicular spin-transfer-torque magnetic-random-access memory (pSTT-MRAM) using the perpendicular magnetoresistive elements as basic memory cells which potentially replace the conventional semiconductor memory used in electronic chips, especially mobile chips for power saving and non-volatility.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three layer stack structure formed by stacking a recording layer having a changeable magnetization direction, an insulating spacing layer, and a fixed layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element, both two magnetization films have easy axis of magnetization in a direction perpendicular to the film plane due to their strong magnetic crystalline anisotropy, shape anisotropies are not used, and accordingly, the device shape can be made smaller than that of an in-plane magnetization type. Also, variance in the easy axis of magnetization can be made smaller. Accordingly, by using a material having a large magnetic crystalline anisotropy, both miniaturization and lower currents can be expected to be achieved while a thermal disturbance resistance is maintained.

There has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved. However, where a MTJ is formed as a device of a perpendicular magnetization type, the materials of the recording layer typically used in an in-plane MTJ for both high MR and low damping constant as required by low write current application normally don't have enough magnetic crystalline anisotropy to achieve thermally stable perpendicular magnetization against its demagnetization field. In order to obtain perpendicular magnetization with enough thermal stability, the recording layer has to be ferromagnetic coupled to additional perpendicular magnetization layer, such as TbCoFe, or CoPt, or multilayer such as (Co/Pt)n, to obtain enough perpendicular anisotropy. Doing so, reduction in write current becomes difficult due to the fact that damping constant increases from the additional perpendicular magnetization layer and its associated seed layer for crystal matching and material diffusion during the heat treatment in the device manufacturing process.

In a spin-injection MRAM using a perpendicular magnetization film, a write current is proportional to the damping constant and inversely proportional to a spin polarization, and increases in proportional to a square of an area size. Therefore, reduction of the damping constant, increase of the spin polarization, maintain of the perpendicular anisotropy and reduction of an area size are mandatory technologies to reduce the write current.

BRIEF SUMMARY OF THE PRESENT INVENTION

The present invention comprises perpendicular magnetoresistive elements and methods of forming such perpendicular magnetoresistive elements for perpendicular spin-transfer-torque MRAM. The perpendicular magnetoresistive element in the invention is sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

In one embodiment, a method is to provided to form a perpendicular magnetoresistive element that includes: forming a reference layer having magnetic anisotropy in a direction perpendicular to a film surface and having an invariable magnetization direction; forming a tunnel barrier layer on the reference layer; forming a recording layer comprising an amorphous CoFeB alloy on the tunnel barrier layer; forming an oxide buffer layer on the recording layer; forming a sacrificial layer comprising a boron-absorbing composition on the oxide buffer layer; conducting a thermal annealing process to diffuse boron atoms from the recording layer to the sacrificial layer; removing the whole sacrificial layer or most of the sacrificial layer; forming a cap layer on the oxide buffer layer, wherein the oxide buffer layer is sufficiently thin such that boron atoms in the recording layer diffuse across the oxide buffer layer into the sacrificial layer during the thermal annealing process that transforms the recording layer into a crystalline CoFe alloy. An optional protective layer can be formed atop the sacrificial layer before an ex-situ thermal annealing process, instead of an in-situ thermal annealing process.

In another embodiment, a method is to provided to form a perpendicular magnetoresistive element that includes: forming a reference layer having magnetic anisotropy in a direction perpendicular to a film surface and having an invariable magnetization direction; forming a tunnel barrier layer on the reference layer; forming a first recording layer of an amorphous CoFeB alloy on the tunnel barrier layer; forming a first oxide buffer layer on the first recording layer; forming a first sacrificial layer comprising a boron-absorbing composition on the first oxide buffer layer; conducting a first thermal annealing process to diffuse boron atoms from the first recording layer to the first sacrificial layer; removing the whole first sacrificial layer or most of the first sacrificial layer; forming a second recording layer of an amorphous CoFeB alloy on the first oxide buffer layer; forming a second oxide buffer layer on the second recording layer; forming a second sacrificial layer comprising a boron-absorbing composition on the second oxide buffer layer; conducting a second thermal annealing process to diffuse boron atoms from the second recording layer to the second sacrificial layer; removing the whole second sacrificial layer or most of the second sacrificial layer; forming a cap layer on the second oxide buffer layer, wherein the first oxide buffer layers is sufficiently thin such that boron atoms in the first recording layer diffuse across the first oxide buffer layer into the first sacrificial layer during the first thermal annealing process that transforms the first recording layer into a crystalline CoFe alloy, and the second oxide layers is sufficiently thin such that boron atoms in the second recording layer diffuse across the second oxide buffer layer into the second sacrificial layer during the second thermal annealing process that transforms the second recording layer into a crystalline CoFe alloy.

In another aspect, a perpendicular magnetoresistive element comprises (counting from the element bottom): a reference layer having magnetic anisotropy in a direction perpendicular to a film surface and having an invariable magnetization direction; a tunnel barrier layer; a crystalline recording layer having magnetic anisotropy in a direction perpendicular to a film surface and having a variable magnetization direction; an oxide buffer layer; and a cap layer, wherein the crystalline recording layer consists of a CoFe alloy that is substantially free of boron and has BCC (body centered cubic) CoFe grains having epitaxial growth with (100) plane parallel to a film surface.

DETAILED DESCRIPTION OF THE INVENTION

The invention comprises perpendicular magnetoresistive elements (PME) as basic memory cells of a perpendicular spin-transfer-torque magnetic-random-access memory (pSTT-MRAM), which potentially replace the conventional semiconductor memory used in electronic chips, especially mobile chips for power saving and non-volatility. In general, according to the following embodiments, said PME comprises:

a reference layer having magnetic anisotropy in a direction perpendicular to a film surface and having an invariable magnetization direction, wherein said reference layer contains a hard magnet/soft magnetic bi-layer or multi-layer superlattice structure;

a tunnel barrier layer provided on the top surface of said reference layer, wherein said tunnel barrier layer is an oxide, such as MgO, MgZnO, MgAlO;

a recording layer provided on the top surface of said tunnel barrier layer and having magnetic anisotropy in a direction perpendicular to a film surface and having a variable magnetization direction, wherein said recording layer contains a single soft ferromagnetic layer or a tri-layer stack having two soft ferromagnetic layers separated by a non-magnetic metal layer, comprising a CoFeB alloy as deposited;

a buffer layer provided on the top surface of said recording layer, wherein said buffer layer is made of a metal oxide comprising at least one element selected from the group consisting of Mg, Zn, Al, Ca, Cd, Ta, Ti, Hf, Cr, Pd, Pt, Ru, W and Mo, and has a thickness no more than 1.0 nm;

a sacrificial layer deposited on the top surface of said buffer layer, and late removed by an etching process after a thermal annealing process in which boron atoms diffuse from said recording layer into said sacrificial layer and said recording layer is crystallized into a CoFe alloy that is substantially free of boron and has BCC CoFe grains having epitaxial growth with (100) plane parallel to a film surface, wherein said sacrificial layer comprises a boron-absorbing composition; and a cap layer provided on the top surface of said oxide layer.

First Embodiment

Figure 1A:
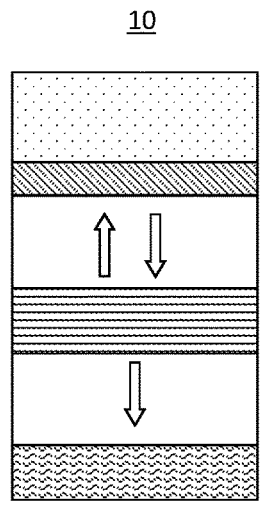
FIG. 1A is a cross-sectional view showing a configuration of an MTJ element 10 that is thermally annealed after initial deposition, according to the first embodiment.

FIG. 1A is a cross-sectional view showing a configuration of an MTJ element that is thermally annealed after initial deposition, according to the first embodiment. The MTJ element 10 is configured by stacking a bottom electrode 11, a reference layer 12, a tunnel barrier layer 13, a recording layer 14, a buffer layer 15, and a sacrificial layer 16 in this order from the element bottom.

The recording layer 14 made of a soft magnetic layer or a soft-magnet/non-magnetic metal/soft-magnet tri-layer, and the reference layer 12 both have uni-axial magnetic anisotropy in a direction perpendicular to a film surfaces. Further, directions of easy magnetization of the recording layer 14 and the reference layer 12 are also perpendicular to the film surfaces. In another word, the MTJ element 10 is a perpendicular MTJ element in which magnetization directions of the recording layer 14 and the reference layer 12 are in directions perpendicular to the film surfaces. A direction of easy magnetization is a direction in which the internal magnetic energy is at its minimum where no external magnetic field exists. Meanwhile, a direction of hard magnetization is a direction which the internal energy is at its maximum where no external magnetic field exists.

The recording layer 14 has a variable (reversible) magnetization direction and the reference layer 12 has an invariable (fixing) magnetization direction. The reference layer 12 is made of a hard magnet/soft-magnet bi-layer having a perpendicular magnetic anisotropic energy which is sufficiently greater than the recording layer 14. This strong perpendicular magnetic anisotropy can be achieved by selecting a material, configuration and a film thickness. In this manner, a spin polarized current may only reverse the magnetization direction of the recording layer 14 while the magnetization direction of the reference layer 12 remains unchanged. The tunnel barrier layer 13 is made of a non-magnetic material for which a non-magnetic insulating metal oxide or nitride can be used.

The buffer layer 15 may serve to introduce or improve perpendicular magnetic anisotropy of the recording layer 14. A damping constant of the recording layer 14 sometimes increases (deteriorates) depending on a material in contact with the recording layer 14, which is known as a spin pumping effect. The buffer layer 15 may also have a function to prevent increase of the damping constant of the recording layer 14 by reducing the spin pumping. The buffer layer 15 is made of an oxide layer which has a rocksalt crystalline as its naturally stable structure thereof will be described later. The sacrificial layer 16 comprises a boron-absorbing composition, such as Ta, Ti, Mo, Hf, etc.

An example configuration of the MTJ element 10 comprises a reference layer 12 made of TbCoFe (5-15 nm)/CoFeB (0.8-2 nm) or (Pd/Co)$_n$/CoFeB with n between 1 and 5, a tunnel barrier layer 13 made of MgO (1 nm), a recording layer made of CoFeB (1.5 nm), a buffer layer 15 made of MgZnO or MgZnO (0.7 nm) and a sacrificial layer 16 made of Ta (5 nm). Each element written in the left side of "/" is stacked below an element written in the right side thereof.

Since a high resistance layer can be formed when the MgZnO buffer layer is used, a read output is caused to decrease when a read current flows across MgZnO buffer layer. A resistance of the MgZnO buffer layer can be reduced and decrease of the read output can accordingly be reduced by adopting a surface oxidization process, i.e. by using of a mixed gas containing natural oxygen ($O_2$), or radical, or ionized oxygen and Argon (Ar) after co-sputtering Mg and Zn metal layer. Such MgZnO composition contains less oxygen in the portion of the buffer layer facing to the base layer than the composition by sputtering of MgZnO or co-sputtering of Mg and Zn in a mixed gas containing oxygen ($O_2$) and Argon (Ar).

The CoFeB (with B content no less than 30%) layer comprised in the recording layer 14 is formed into an amorphous state as deposited. The MgZnO material comprised in the buffer layer 15 is formed into rocksalt crystal grains with the (100) plane parallel to the substrate plane. In a rocksalt crystal structure, two FCC (face-centered cubic) sublattices for metal atom (Mg or Zn) and O, each displaced with respect to the other by half lattice parameter along the [100] direction. Its lattice parameter along the {110} direction is ranged from 2.98 to 3.02 angstrom, which has slightly larger than BCC CoFe lattice parameter along {100} direction and has a lattice mismatch between 4% and 7%. After an in-situ thermal annealing with a temperature higher than 250-degree Celsius, the amorphous CoFeB is crystallized to form BCC CoFe grains having epitaxial growth with (100) plane parallel to surface of the rocksalt crystal buffer layers with in-plane expansion and out-of-plane contraction. During the thermal annealing process, boron atoms from said recording layer 14 diffuse across the thin buffer 15 into the sacrificial layer 16 which is a boron-absorbing layer. The recording layer is then crystallized into a CoFe alloy that is substantially free of boron and has BCC CoFe grains having epitaxial growth with (100) plane parallel to a film surface. A relatively pure CoFe film has a lower damping constant than an amorphous CoFeB film. A typical damping constant for a pure CoFe is around 0.003, while CoFeB has a damping constant of 0.01. Accordingly, a perpendicular magnetization having a low damping constant is induced in the recording layer.

Figure 1B:
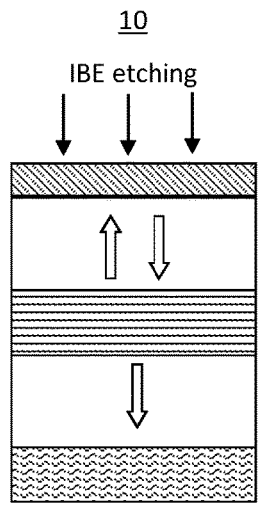
FIG. 1B is a cross-sectional view showing a configuration of an MTJ element 10 after removing the sacrificial layer by an IBE etching process, according to the first embodiment.
Figure 2:
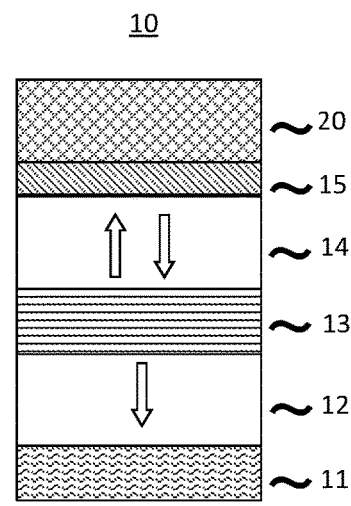
FIG. 2 is cross-sectional view showing a configuration of an MTJ element 10 after depositing the cap layer.

As shown in FIG. 1B, after the thermal annealing process, an IBE etching process is conducted to etch away the whole sacrificial layer 16 or most of it, leaving the buffer layer 15 remained. The cap layer 20 is then deposited on the top of the buffer layer 16 after the etching, and a final MTJ element is formed as shown in FIG. 2.

Second Embodiment

Figure 3A:
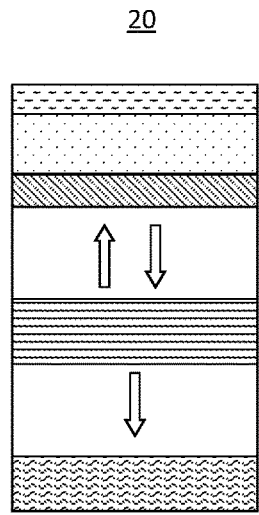
FIG. 3A is a cross-sectional view showing a configuration of an MTJ element 20 that is thermally annealed after initial deposition, according to the second embodiment.

FIG. 3A is a cross-sectional view showing a configuration of an MTJ element 20 that is thermally annealed after initial deposition, according to the second embodiment. The MTJ element 20 is configured by stacking a bottom electrode 11, a reference layer 12, a tunnel barrier layer 13, a recording layer, a buffer layer 15, a sacrificial layer 16, and a protective layer 18, in this order from bottom to top.

While the other layers in FIG. 3A are all the same as described in first embodiment (FIG. 1A), the protective layer 18 made of noble metal material is deposited at the most top. Naturally, a noble metal is not oxidized so that it prevents the sacrificial layer from oxidation even if a thermal annealing process is conducted in a separate annealing oven. In another word, an ex-situ annealing process can be employed, instead of an in-situ annealing process.

An example configuration of the MTJ element 20 comprises a reference layer 12 made of a bi-layer TbCoFe(5-15 nm)/CoFeB (0.8-2 nm) or a multi-layer (Pd/Co)$_n$/CoFeB with n between 1-5, a tunnel barrier layer 13 made of MgO (1 nm), a recording layer 14 made of CoFeB (1.5 nm)/(W or Mo (0.2 nm))/CoFeB (1.0 nm), a buffer layer 15 made of MgO (0.7 nm)/Ru (0.2 nm), a sacrificial layer 16 made of Ta (5 nm) and a protective layer 18 made of Ru (7 nm). Note that here the buffer layer 15 has a bi-layer structure comprising an oxide layer of MgO and an ultra-thin metal layer of Ru which is an oxidization-resistive metal material having a FCC or HCP crystalline phase, so that the oxide layer has an improved quality of crystalline structure due to the ultra-thin metal material. The thickness of the ultra-thin metal layer is no more than two atomic layers such that boron atoms of the recording layer 14 can easily diffuse across the buffer layer 15 into the sacrificial layer 16 during a thermal annealing process. Each element written in the left side of "l" is stacked below an element written in the right side thereof.

The CoFeB material in the CoFeB/(W or Mo)/CoFeB tri-layer (with B content no less than 20%) in the recording layer 14 is formed into an amorphous state as deposited. After thermal annealing with a temperature higher than 250-degree Celsius, the amorphous CoFeB is crystallized to form BCC CoFe grains having epitaxial growth with (100) plane parallel to surface of the rocksalt crystal buffer layers with in-plane expansion and out-of-plane contraction. During the thermal annealing process, boron atoms from the recording layer 14 diffuse across the thin buffer 15 into the sacrificial layer 16 which is a boron-absorbing layer. Accordingly, a perpendicular magnetization is induced in the recording layer.

Figure 3B:
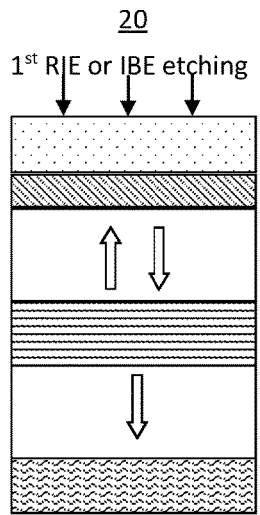
FIG. 3B is a cross-sectional view showing a configuration of an MTJ element 20 after removing the protective layer by a RIE etching process or a first IBE etching process, according to the second embodiment.
Figure 3C:
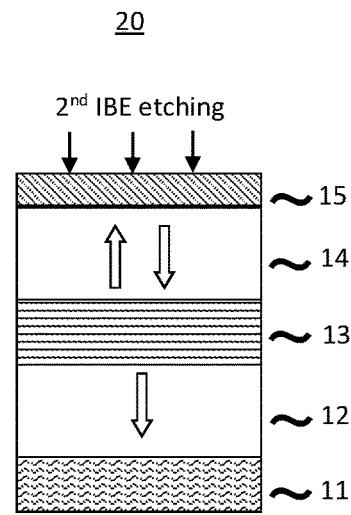
FIG. 3C is a cross-sectional view showing a configuration of an MTJ element 20 after removing the sacrificial layer by a second IBE etching process, according to the second embodiment.

As shown in FIG. 3B, after the thermal annealing process, a RIE etching process or a first IBE etching process is adopted to etch away the top protective layer 18. And as shown in FIG. 3C, a second IBE etching process is adopted to etch away the whole sacrificial layer 16 or most of it, leaving the buffer layer 15 remained. The cap layer 20 is then deposited on the top of the buffer layer 16 after the etching, forming a final MTJ element. In fact, the final MTJ element of the second embodiment is the same as the one in the first embodiment, as shown in FIG. 2.

Third Embodiment

Figure 4A:
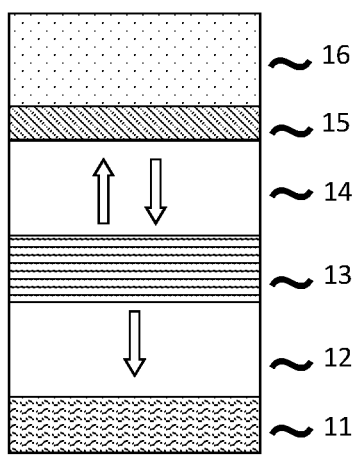
FIG. 4A is a cross-sectional view showing a configuration of an MTJ element 100 that is thermally annealed after initial deposition, according to the third embodiment.

FIG. 4A is a cross-sectional view showing a configuration of an MTJ element that is first thermally annealed after initial deposition, according to the third embodiment. The MTJ element 30 is configured by stacking a bottom electrode 11, a reference layer 12, a tunnel barrier layer 13, a recording layer 14, a first buffer layer 15, and a first sacrificial layer 16, in this order from the element bottom.

Figure 4B:
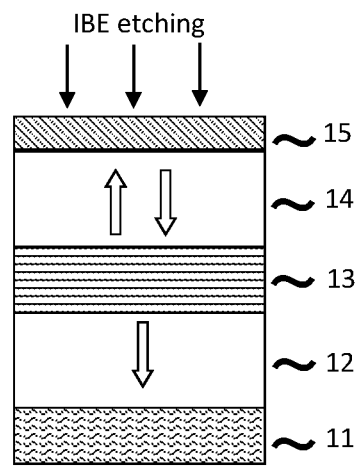
FIG. 4B is a cross-sectional view showing a configuration of an MTJ element 100 after removing the first sacrificial layer by a first IBE etching process, according to the third embodiment.
Figure 4C:
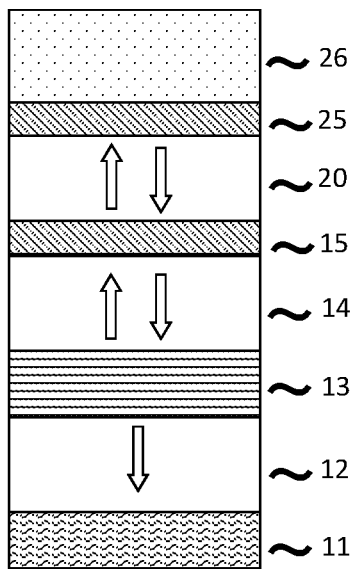
FIG. 4C is a cross-sectional view showing a configuration of an MTJ element 100 that is thermally annealed after sequentially depositing a second recording layer, a second oxide layer and a second sacrificial layer, according to the third embodiment.
Figure 4D:
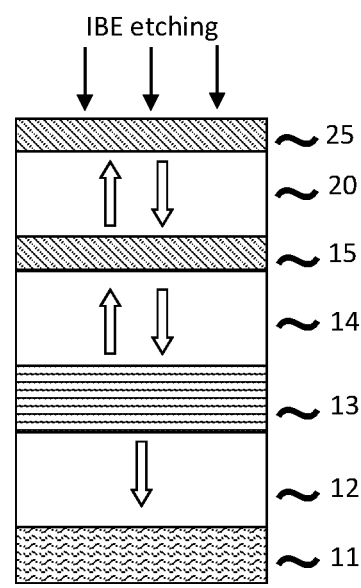
FIG. 4D is a cross-sectional view showing a configuration of an MTJ element 100 after removing the second sacrificial layer by a second IBE etching process, according to the third embodiment.
Figure 5:
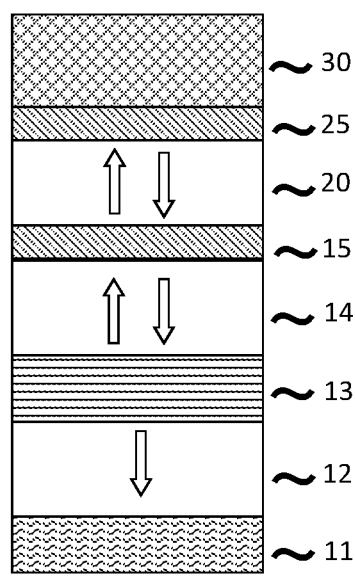
FIG. 5 is a cross-sectional view showing a configuration of an MTJ element 100 after depositing the cap layer, according to the third embodiment.

While the layers above are the same as described in first embodiment (FIG. 1A), a first IBE etching process is adopted to etch away the whole first sacrificial layer 16 or most of it, leaving the first buffer layer 15 remained, as shown as FIG. 4B, which is also the same as described in first embodiment (FIG. 1B). Instead of depositing a cap layer, a sequential deposition is conducted: depositing a second recording layer 20; depositing a second buffer layer 25; and depositing a second sacrificial layer 26, and further a second thermal annealing process is conducted, as shown in FIG. 4C. As deposited, the second recording layer 20 is a CoFeB layer or a CoFeB/(W or Mo)/CoFeB tri-layer in an amorphous state, the second buffer layer 25 is an oxide layer which has a rocksalt crystalline, the second sacrificial layer comprises a boron-absorbing composition, such as Ta, Ti, Mo, Hf, etc. After a second in-situ thermal annealing with a temperature higher than 250-degree Celsius, the amorphous CoFeB in the second recording layer 20 is crystallized to form BCC CoFe grains having epitaxial growth with (100) plane parallel to surface of the rocksalt crystal buffer layers with in-plane expansion and out-of-plane contraction. During the thermal annealing process, boron atoms in the second recording layer 20 diffuse across the second buffer 25 into the second sacrificial layer 26 which is a boron-absorbing layer. The second recording layer 20 is then crystallized into a CoFe alloy that is substantially free of boron and has BCC CoFe grains having epitaxial growth with (100) plane parallel to a film surface. A relatively pure CoFe film has a lower damping constant than an amorphous CoFeB film. A typical damping constant for a pure CoFe is around 0.003, while CoFeB has a damping constant of 0.01. Accordingly, a perpendicular magnetization having a low damping constant is induced in the recording layer. As shown in FIG. 4D, after the thermal annealing process, an IBE etching process is adopted to etch away the whole second sacrificial layer 26 or most of it, leaving the second buffer layer 25 remained. A cap layer 30 is then deposited on the top of the second buffer layer 25 after the etching, and a final MTJ element is formed as shown in FIG. 5.

While certain embodiments have been described above, these embodiments have been presented by way of example only, and are not intended to limit the scope of the inventions. In principle, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method of manufacturing a perpendicular magnetoresistive element (PME) comprising the steps of:
    forming a reference layer having a magnetic anisotropy in a direction substantially perpendicular to a film surface and having an invariable magnetization direction;
    forming a tunnel barrier layer atop the reference layer;
    depositing a recording layer, atop the tunnel barrier layer, comprising a boron (B) alloy having at least one of iron (Fe) and cobalt (Co);
    forming a buffer layer comprising an oxide layer atop the recording layer;
    forming a sacrificial layer, atop the buffer layer, comprising a boron-absorbing composition;
    conducting a plurality of thermal annealing processes to diffuse boron atoms of the recording layer through the buffer layer into the sacrificial layer, wherein, after the plurality of thermal annealing processes, the recording layer has a magnetic anisotropy in a direction substantially perpendicular to a film surface and having a variable magnetization direction;
    removing the sacrificial layer or most of the sacrificial layer; and
    forming a cap layer atop the buffer layer.

2. The element of claim 1, wherein the tunnel barrier layer is made of MgO, MgZnO, MgZrO, or MgAlO.

3. The element of claim 1, wherein, after depositing the recording layer, the recording layer comprises boron, in form(s) including but not limited to one or more of CoFeB, CoB and FeB, ideally with a ratio of boron between 10% and 30%.

4. The element of claim 1, wherein, after depositing the recording layer, the recording layer is a tri-layer comprising a first magnetic alloy layer including at least one of CoFeB, CoFeB/CoFe, Fe/CoFeB, FeB/CoFeB and CoFe/CoFeB, a second magnetic alloy layer including at least one of CoFeB and CoB, an insertion layer provided between the first magnetic alloy layer and the second magnetic alloy layer and containing at least one element selected from the group consisting of Ta, Hf, Zr, Ti, Mg, Nb, W, Mo, Ru, Al, Cu, Si and having a thickness less than 0.5 nm.

5. The element of claim 1, wherein the oxide layer is made of a metal oxide comprising at least one element selected from the group consisting of Mg, Ti, Ta, Na, Li, Ca, Zn, Zr, Cd, In, Sn, Ru, Al, Cu, Ag and Ni, and having a thickness less than 1.0 nm.

6. The element of claim 1, wherein the buffer layer further comprises a metal material layer, atop the oxide layer, comprising at least one element selected from the group consisting of Pt, Ru, Rh, Pd, Ir, Ni, Cu, Ag, Au and alloy thereof, and having a thickness less than 0.5 nm.

7. The element of claim 1, wherein the cap layer is a non-magnetic metal layer comprising at least one element selected from the group consisting of Pt, Ta, Hf, Zr, Ti, Mg, Nb, W, Mo, Ru, Ir, Al, Cu and alloy thereof, or non-magnetic nitride layer selected from the group consisting of AlN, NbN, ZrN, IrN, TaN, TiN, and SiN.

8. The element of claim 1, wherein the boron-absorbing composition comprises Ta, Hf, Ti, V, Mo, W, Zr, Nb or alloy thereof.

9. The element of claim 1, further comprising forming a protective layer between said forming the sacrificial layer and said conducting the thermal annealing process, wherein the protective layer is made of an oxidization-resistive alloy or a noble metal, preferred to be selected from the group consisting of Pt, Pd, Ru, Cu, Ag, Ir, Rh and Au.

10. The element of claim 1, further comprising forming an oxidization process, between said removing the most of the sacrificial layer and said forming the cap layer, conducted by using of a mixed gas containing natural, or radical, or ionized oxygen and Argon (Ar) to oxidize the remained sacrificial layer.

11. A method of manufacturing a perpendicular magnetoresistive element (PME) comprising the steps of:
forming a reference layer having a magnetic anisotropy in a direction substantially perpendicular to a film surface and having an invariable magnetization direction;
forming a tunnel barrier layer atop the reference layer;
depositing a first recording layer, atop the tunnel barrier layer, comprising a boron (B) alloy having at least one of iron (Fe) and cobalt (Co);
forming a first buffer layer comprising a first oxide layer atop the first recording layer;
forming a first sacrificial layer, atop the first buffer layer, comprising a boron-absorbing composition;
conducting a first thermal annealing process to diffuse boron atoms of the first recording layer through the first buffer layer into the first sacrificial layer, wherein, after the first thermal annealing process, the first recording layer has a first magnetic anisotropy in a direction substantially perpendicular to a film surface and having a variable magnetization direction;
removing the first sacrificial layer or most of the first sacrificial layer;
depositing a second recording layer, atop the first buffer, comprising a boron (B) alloy having at least one of iron (Fe) and cobalt (Co);
forming a second buffer layer comprising a second oxide layer atop the second recording layer;
forming a second sacrificial layer, atop the second buffer layer, comprising a boron-absorbing composition;
conducting a second thermal annealing process to diffuse boron atoms of the second recording layer through the second buffer layer into the second sacrificial layer, wherein, after the second thermal annealing process, the second recording layer has a second magnetic anisotropy in a direction substantially perpendicular to a film surface and having a variable magnetization direction;
removing the second sacrificial layer or most of the second sacrificial layer; and
forming a cap layer atop the second buffer layer.

12. The element of claim 11, wherein the tunnel barrier layer is made of MgO, MgZnO, MgZrO, or MgAlO.

13. The element of claim 11, wherein, after depositing each of the first recording layer and the second recording layer, each of the first recording layer and the second recording layer comprises boron, in form(s) including but not limited to one or more of CoFeB, CoB and FeB, ideally with a ratio of boron between 10% and 30%.

14. The element of claim 11, wherein, after depositing each of the first recording layer and the second recording layer, at least one of the first recording layer and the second recording layer is a tri-layer comprising a first magnetic alloy layer including at least one of CoFeB, CoFeB/CoFe, Fe/CoFeB, FeB/CoFeB and CoFe/CoFeB, a second magnetic alloy layer including at least one of CoFeB and CoB, an insertion layer provided between the first magnetic alloy layer and the second magnetic alloy layer and containing at least one element selected from the group consisting of Ta, Hf, Zr, Ti, Mg, Nb, W, Mo, Ru, Al, Cu, Si and having a thickness less than 0.5 nm.

15. The element of claim 11, wherein each of the first oxide layer and the second oxide layer is made of a metal oxide comprising at least one element selected from the group consisting of Mg, Ti, Ta, Na, Li, Ca, Zn, Zr, Cd, In, Sn, Ru, Al, Cu, Ag and Ni, and having a thickness less than 1.0 nm.

16. The element of claim 11, wherein each of the first buffer layer and the second buffer layer further comprises a metal material layer, atop each of the first oxide layer and the second oxide layer, comprising at least one element selected from the group consisting of Pt, Ru, Rh, Pd, Ir, Ni, Cu, Ag, Au and alloy thereof, and having a thickness less than 0.5 nm.

17. The element of claim 11, wherein the cap layer is a non-magnetic metal layer comprising at least one element selected from the group consisting of Pt, Ta, Hf, Zr, Ti, Mg, Nb, W, Mo, Ru, Ir, Al, Cu and alloy thereof, or non-magnetic nitride layer selected from the group consisting of AlN, NbN, ZrN, IrN, TaN, TiN, and SiN.

18. The element of claim 11, wherein the boron-absorbing composition comprises Ta, Hf, Ti, V, Mo, W, Zr, Nb or alloy thereof.

19. The element of claim 11, further comprising forming a separating layer between said removing the first sacrificial layer or most of the first sacrificial layer and said forming the second recording layer, wherein the separating layer is made of non-magnetic material and has a thickness between 0.5 nm and 3 nm.

20. The element of claim 11, further comprising forming an oxidization process, between said removing the most of the sacrificial layer and said forming the cap layer, conducted by using of a mixed gas containing natural, or radical, or ionized oxygen and Argon (Ar) to oxidize the remained sacrificial layer.

* * * * *